(12) United States Patent
Borodulin et al.

(10) Patent No.: US 8,948,306 B2
(45) Date of Patent: Feb. 3, 2015

(54) BROADBAND HIGH EFFICIENCY AMPLIFIER SYSTEM

(71) Applicant: HBC Solutions, Inc., Englewood, CO (US)

(72) Inventors: Dmitri Borodulin, South Lebanon, OH (US); George Cabrera, Mason, OH (US)

(73) Assignee: Gatesair, Inc., Mason, OH (US)

( * ) Notice: Subject to any disclaimer, the term of this patent is extended or adjusted under 35 U.S.C. 154(b) by 0 days.

(21) Appl. No.: 13/739,505

(22) Filed: Jan. 11, 2013

(65) Prior Publication Data

US 2014/0198880 A1 Jul. 17, 2014

(51) Int. Cl.
| H03C 1/52 | (2006.01) |
| H04L 27/04 | (2006.01) |
| H03F 3/19 | (2006.01) |
| H03F 3/60 | (2006.01) |
| H03F 3/72 | (2006.01) |

(52) U.S. Cl.
CPC ........ *H04L 27/04* (2013.01); *H03F 3/19* (2013.01); *H03F 3/602* (2013.01); *H03F 3/72* (2013.01)
USPC .......... 375/300; 330/295; 330/124 R

(58) Field of Classification Search
USPC .......... 375/297, 300; 330/295, 124 R
See application file for complete search history.

(56) References Cited

U.S. PATENT DOCUMENTS

| 5,150,072 A | 9/1992 | Malec |
| 6,236,284 B1 | 5/2001 | Duello |
| 6,362,685 B1 * | 3/2002 | Vagher .................. 330/124 R |
| 6,396,340 B1 | 5/2002 | Schmitt |
| 7,262,656 B2 | 8/2007 | Shiikoma |
| 2003/0132800 A1 * | 7/2003 | Kenington .............. 330/124 R |
| 2004/0189381 A1 | 9/2004 | Louis |
| 2008/0180169 A1 * | 7/2008 | Ripley et al. ................. 330/133 |

(Continued)

FOREIGN PATENT DOCUMENTS

| EP | 0083727 A1 | 7/1983 |
| EP | 0887924 A2 | 12/1998 |

(Continued)

OTHER PUBLICATIONS

Sarkeshi, et al. "A Novel Configuration for the Doherty Amplifier for Load Modulation Enhancement and Bandwidth Improvement", Research Paper—Singapore, Date Unknown, pp. 246-249.

(Continued)

*Primary Examiner* — Curtis Odom
(74) *Attorney, Agent, or Firm* — Tarolli, Sundheim, Covell & Tummino LLP

(57) ABSTRACT

Systems and methods are provided for generating a modulated radio frequency (RF) output signal representing a baseband input signal. A digitizer is configured to sample the baseband input signal and produce an N-bit binary digital signal representing a scaled linear function of the signal amplitude. An RF signal source configured to produce an RF carrier signal. N amplifier paths each include at least one amplifier configured to receive the RF carrier signal as an input and provide a corresponding output RF signal. The amplifiers associated with each of the N amplifier paths are active only when a corresponding bit of the digital signal assumes a first value. A power combiner assembly is configured to combine the outputs of the plurality of amplifier paths to deliver the modulated RF output signal.

20 Claims, 5 Drawing Sheets

(56) References Cited

U.S. PATENT DOCUMENTS

2008/0290938 A1* 11/2008 Gupta et al. .................. 330/127
2010/0289571 A1    11/2010 Hong et al.

FOREIGN PATENT DOCUMENTS

| EP | 2169823 A1 | 3/2010 |
| WO | WO 2004/088837 A2 | 10/2004 |

OTHER PUBLICATIONS

Burns, "Highly Efficient Amplifier Shows he Promise of Doherty Architecture", WWW.RFDESIGN.COM, Jun. 2007, 3 pages.

Mitzlaff, et al., "Novel Combiner Circuits for a Doherty RF Power Amplifier", www.ip.com—Prior Art Database, Jul. 22, 2002, 12 pgs.

European Search Report received with Printed Publication of Published European Application No. 14000085.2; Jul. 28, 2014; 2 pp.

\* cited by examiner

BROADBAND HIGH EFFICIENCY AMPLIFIER SYSTEM

TECHNICAL FIELD

The present invention relates to radio frequency (RF) communication systems and is particularly directed to systems and methods for high power amplification of RF signals.

BACKGROUND OF THE INVENTION

An electronic amplifier is a device for increasing the power of a signal. Generally, an amplifier outputs energy from a provided power supply and controls the output to match an associated shape of an input signal with a larger amplitude. There are many types of electronic amplifiers, and they are commonly used in radio and television transmitters and receivers, high-fidelity stereo equipment, microcomputers and other electronic digital equipment, and audio amplifiers.

SUMMARY OF THE INVENTION

In accordance with an aspect of the present invention, a system is provided for generating a modulated radio frequency (RF) output signal representing a baseband input signal. A digitizer is configured to sample the baseband input signal and produce an N-bit digital signal representing a scaled linear function of the signal amplitude. An RF signal source configured to produce an RF carrier signal. N amplifier paths each include at least one amplifier configured to receive the RF carrier signal as an input and provide a corresponding output RF signal. The amplifiers associated with each of the N amplifier paths are active only when a corresponding bit of the digital signal assumes a first value. A power combiner assembly is configured to combine the outputs of the plurality of amplifier paths to deliver the modulated RF output signal.

In accordance with another aspect of the present invention, a method is provided for generating a modulated radio frequency (RF) output signal representing a baseband input signal. A sample of the baseband input signal is digitized to provide an N-bit digital signal representing an amplitude of the baseband input signal. An RF carrier signal is provided to each of N amplifier assemblies. Each of the N amplifier assemblies is operated according to the value of a corresponding bit within the N-bit word, such that a given amplifier assembly is active when its associated bit assumes a first value and mute when its associated bit assumes a second value. The outputs of the N amplifier assemblies are combined to construct the modulated RF output signal.

In accordance with yet another aspect of the present invention, a system is provided for generating a modulated radio frequency (RF) output signal representing a baseband input signal. A digitizer is configured to sample the baseband input signal and produce a digital signal representing a linear function of the signal amplitude. An RF signal source is configured to produce an RF carrier signal. A plurality of amplifier assemblies each include at least one amplifier configured to receive the RF carrier signal as an input and amplify the RF carrier signal only when a corresponding bit of digital signal assumes a first value. A power combiner assembly is configured to combine the output signals of the plurality of amplifier assemblies to provide the modulated RF output signal. The power combiner assembly includes a series of hybrid combiners, with an output port of each hybrid combiner in the series, other than a final hybrid combiner in the series, being connected to an isolation port of a subsequent hybrid combiner in the series.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

Figure 1:
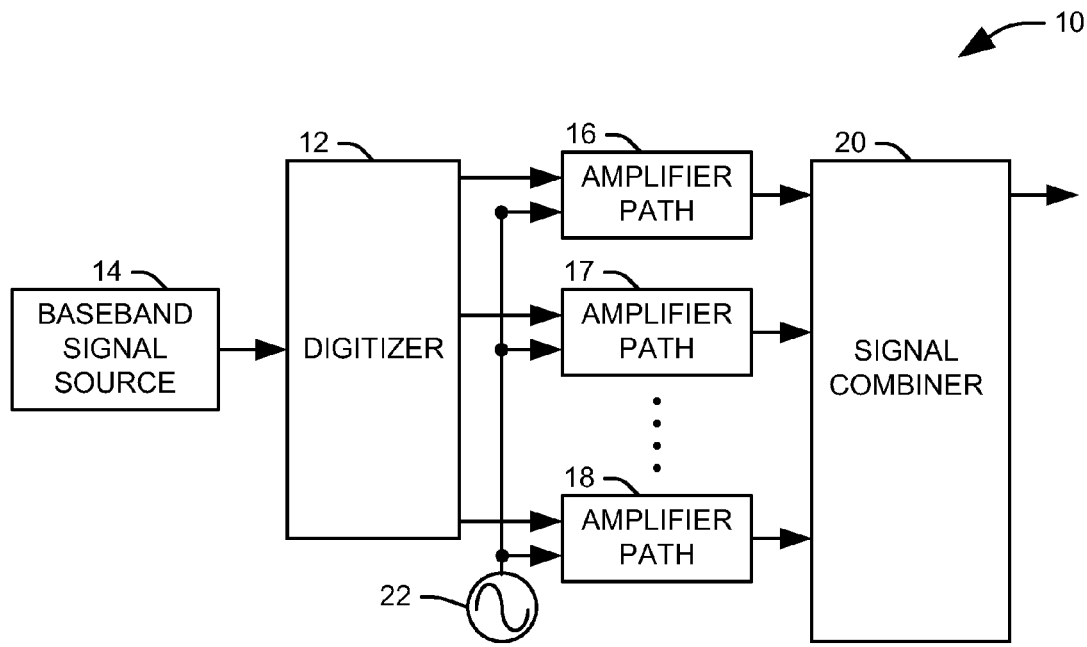
FIG. 1 is a functional block diagram of an amplifier system in accordance with an aspect of the present invention.

FIG. 1 is a functional block diagram of an amplifier system 10 in accordance with an aspect of the present invention. The system 10 includes a signal digitizer 12 configured to receive a baseband input signal from a baseband signal source 14 and acquire samples of the signal's amplitude with a given sampling frequency to produce an N-bit digital signal representing a scaled linear function of the amplitude of the baseband input signal. In this context, N is an integer greater than one. For example, the signal digitizer 12 can include one or more analog to digital converter (ADC) assemblies configured to provide the digital signal at a desired sampling rate.

The signal digitizer 12 can further include a linear transformer (not shown) implemented in a digital domain. The transformer applies a linear function on the sampled amplitude of the baseband input signal to accommodate a particular amplitude modulation type, such as adding a DC component and/or changing sign of the signal. It will thus be appreciated that the digital signal can represent any linear function of the baseband input signal having a non-zero linear coefficient.

The system further includes N amplifier paths 16-18, each associated with one bit of the digital signal produced by the signal digitizer. In one implementation, each amplifier path 16-18 includes a discrete RF phase shifter, an RF switch and an amplifier path. Each plurality of discrete phase shifters that can selectively apply respective phase shift values to the RF carrier signal delivered to its associated amplifier path according to the values of the bits more significant than the associated bit of the amplifier path. Accordingly, in this implementation, the dedicated data bus broadcasts the content of all significant bits in an N-bit binary envelope sequence provided to each discrete phase shifter.

Each RF switch is associated with a particular amplifier path and receptive only to the bit from the N-bit binary envelope sequence associated with its amplifier path. Every time the associated bit assumes a first value, the RF switch connects RF signal from an RF signal source to the input of the associated amplifier assembly. Every time the associated bit assumes a second value, the RF switch disconnects the RF signal from an input of the associated amplifier assembly and effectively mutes the path.

The system further includes a plurality of amplifier paths 16-18 that each receive a radio frequency (RF) carrier signal from an associated RF carrier source 22, for example, delivered through the associated discrete value phase shifter and RF switch. It will be appreciated that a given amplifier path 16-18 can include multiple amplifier stages connected in series or in parallel, connected via appropriate signal splitters and combiners (not shown). The amplifiers associated with a given amplifier path 16-18 can each include an active RF power generating device, such as a bipolar junction transistor (BJT), a metal-oxide semiconductor field effect transistor (MOSFET), or an electronic tube.

Each of the amplifier paths 16-18 that are active at a given time provide an RF output signal to a signal combiner 20. The signal combiner 20 combines the outputs of the plurality of amplifier paths 16-18 to deliver an output signal having amplitude modulation that is essentially a scaled replica of the binary envelope sequence. In one implementation, the signal combiner assembly 20 can include a series of hybrid combiners, with the output of a first amplifier path 16 connected to an isolation port of a first hybrid combiner, and two outputs of a second amplifier path 17 connected to corresponding through and coupled ports of the first hybrid combiner. The output of the first hybrid combiner can be connected to the isolation port of a next hybrid combiner, with two outputs from a third amplifier path connected to corresponding through and coupled ports of the second hybrid combiner. This arrangement can be continued until a final hybrid combiner that receives the combined output signal of the previous amplifier paths at an isolation port, and outputs from a final amplifier path 18 at through and coupled ports. In one example, illustrated in detail in FIGS. 2 and 3, each amplifier path 17-18 after a first amplifier assembly 16 is configured to provide RF signal with twice the voltage level of the RF signal delivered by the previous amplifier path. Accordingly, the output signal from the signal combiner 20 can take on any of $2^N$ voltage values from the binary series $V_{out}=0, V_1, 2V_1, 3V_1, \ldots, 2^{N-1} \cdot V_1, \ldots, (2^N-1) \cdot V_1$, where N is the number of amplifier paths, equal to the dimension of the binary envelope sequence, and $V_1$ is the voltage of output RF signal generated by the first amplifier path.

In accordance with an aspect of the present invention, the operational status of each amplifier path is controlled by the values in the N-bit binary sequence distributed inside of the system by the signal digitizer 12. The operational status of the first amplifier assembly is controlled by the value of a least significant bit (LSB) in the binary sequence. The operational status of the second amplifier assembly is controlled by the value of the second least significant bit in the binary sequence, and so on. Accordingly, in the proceeding discussion, each amplifier path 16-18 can be referenced by its assigned significant bit. For example, the first amplifier path 16 can be referred to as the LSB amplifier path and the last amplifier assembly path can be referred to as the most significant bit (MSB) amplifier path.

Figure 2:
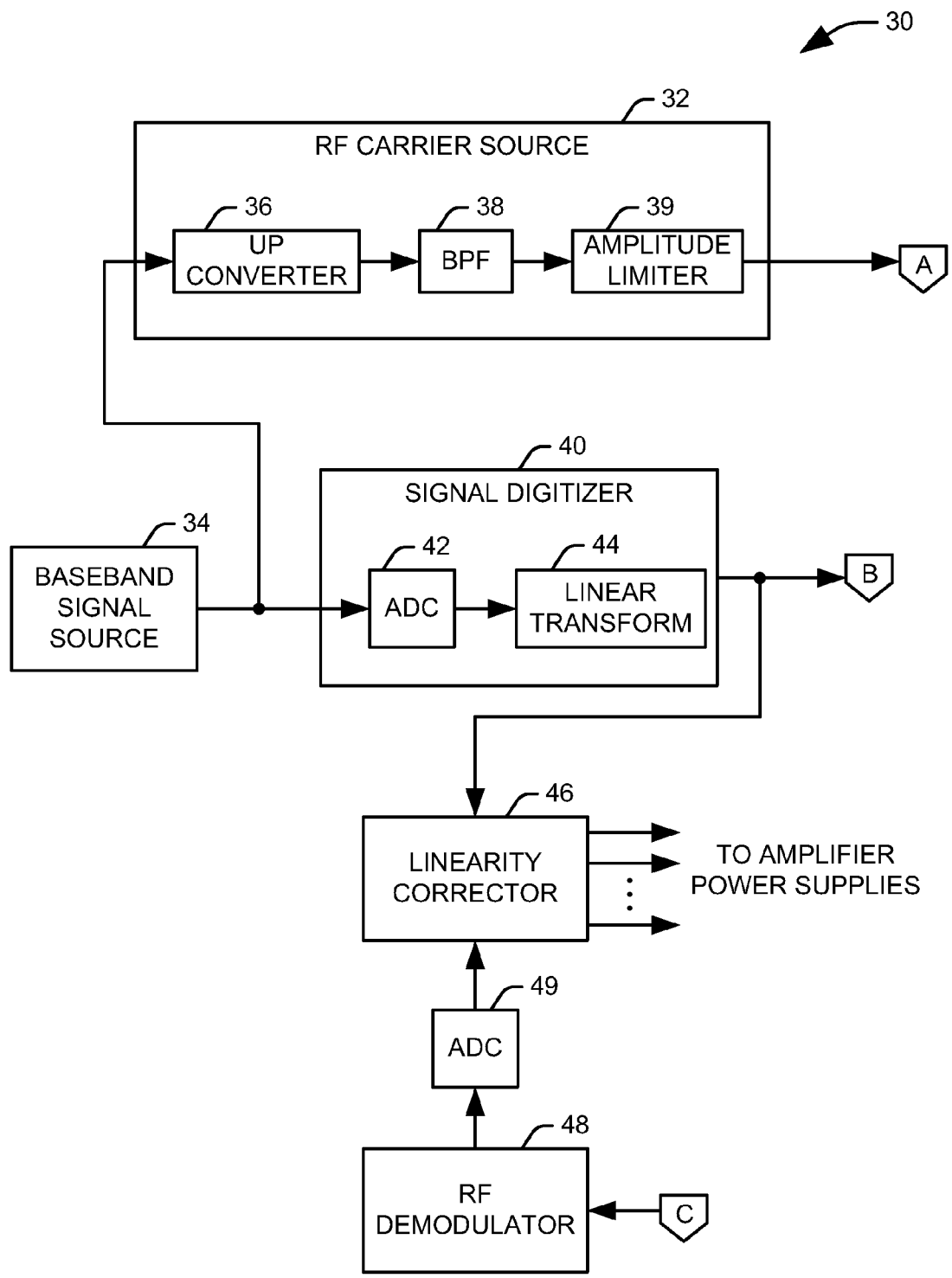
FIGS. 2 and 3 illustrate an example implementation of an amplifier system in accordance with an aspect of the present invention.
Figure 3:
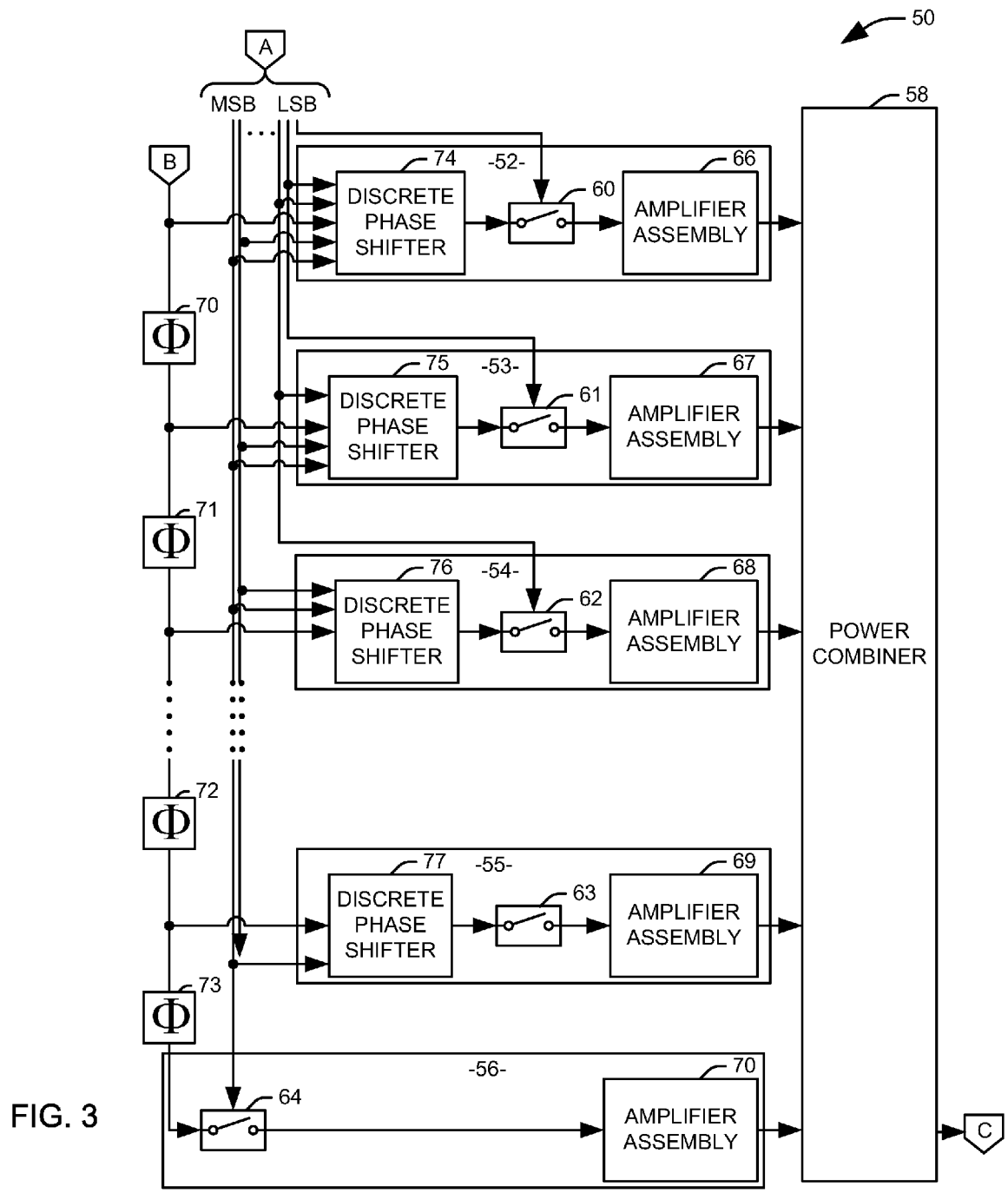

FIGS. 2 and 3 illustrates an example implementation of a system for generating high power and high efficiency amplitude modulated RF signals in accordance with an aspect of the present invention. The illustrated system can be utilized to provide amplitude modulated RF signals over a wide range of operating RF frequencies. High efficiency operation is achieved by employing RF power transistors biased in Class C and driven into voltage saturation mode when operational. A plurality of power amplifiers are arranged in a series of amplifier assemblies and used to amplify an RF carrier signal, with each power amplifier comprising RF power transistors and components arranged to form input and output matching circuits. The output of each amplifier assembly is coupled to one or more corresponding ports of an output power combiner to construct an amplitude modulated output signal.

FIG. 2 illustrates a front end 30 of the illustrated system that provides both a carrier signal provided to each of the plurality of amplifier paths and a digital signal, based on the baseband signal amplitude, to selectively activate the amplifier paths. An RF carrier source 32 receives a baseband input signal from a baseband signal source 34 at a frequency upconverter 36, where the signal is converted to a desired RF frequency. The RF signal is then filtered at a bandpass filter (BPF) 38 around a desired carrier frequency to remove unwanted modulation products and provided to an amplitude limiter 39 that attenuates the signal beyond a desired envelope to remove any remaining amplitude modulation from the signal. The resulting RF carrier signal is provided to the back-end of FIG. 3, at point A.

A signal digitizer 40 samples the baseband input signal at a selected sample rate at an analog-to-digital converter and produces a binary envelope sequence of N-bit digital words, each representing instantaneous envelope of the RF signal, where N is an integer greater than one. In the illustrated implementation, a sequence of N-bit digital words is produced at an analog-to-digital converter 42 and modified at a linear transform 44 to provide a binary envelope sequence representing a linear function of the baseband signal amplitude. It will be appreciated that this linear function can include a linear coefficient applied to the offset, which can be positive or negative, as well as an offset value, depending on the application. In one implementation, the linear coefficient is one and the offset is zero, such that the digital signal represents the baseband signal amplitude without modification. The resulting N-bit digital signal is broadcast to the amplifier assemblies via a dedicated data bus, represented in FIG. 2 as point B.

The N-bit digital signal is also provided to a linearity corrector 46 which ensures that the output of the system is an accurate representation of the N-bit digital signal. A sample of the output signal of the amplifier system, represented by point C, is provided to an RF demodulator 48 to downconvert a provided representation of the system output to the baseband frequency. The downconverted signal is provided to an analog-to-digital converter 49 to produce a digital representation of the downconverted signal. This digital representation is compared to the N-bit digital signal at a linearity corrector to ensure that the system output has amplitude modulation that is an accurate replica of the N-bit digital signal. Any non-linearity introduced by the plurality of amplifier paths can be addressed by altering the supply voltage provided to each path according to this comparison.

FIG. 3 illustrates a back-end 50 of the example system of FIGS. 2 and 3 comprising a plurality of amplifier paths 52-56 and a power combiner 58 for combining the outputs of the plurality of amplifier paths. Each of the N amplifier paths 52-56 is provided with each value of in the N-bit digital signal, provided at the signal digitizer 40 of FIG. 2 and represented as point A in FIG. 3, and is associated with a bit in the N-bit digital signal. For example, a first amplifier path 52 can be associated with a least significant bit (LSB), a second amplifier path 53 can be associate with a next bit, and so on, with a most significant bit (MSB) associated with an $N^{th}$ amplifier path 56. The bit associated with each amplifier path 52-56 is used to control respective RF switches 60-64 in each amplifier path. When the bit associated with a given amplifier path 52-56 takes on a first value (e.g., a "1"), the associated RF switch 60-64 is enabled to deliver an RF signal to an input of an amplifier assembly 66-70 associated with the amplifier path. When the bit associated with the amplifier path 52-56 takes on a second value (e.g., a "0"), the RF switch 60-64 is not enabled, and the amplifier assembly 66-70 is mute.

The input for each amplifier path 52-56 is supplied as an RF carrier signal generated at the RF carrier source 32 of FIG. 2, and represented by point B in FIG. 3. In the illustrated implementation, the RF carrier signal can be delayed by various continuous phase shifters 70-73 associated with the last N−1 amplifier paths 53-56. The purpose of the continuous phase shifters 70-73 is to provide appropriate phase delay between consequent amplifier paths. The delay is needed to account for propagation delays between the amplifier paths 52-56. Introducing appropriate compensating delay assists in providing phase conditions for the RF signals generated by the amplifiers to combine in phase at the output of each combining stage of the power combiner 58. It will be appreciated that the phase delay provided by the continuous phase shifters 70-73 can be adjusted to allow the system to operate at different frequencies.

Each of the first N−1 amplifier paths 52-55 further include a discrete RF phase shifter 74-77 to provide a further delay to the RF carrier signal prior to amplification. Each of the discrete RF phase shifters 74-77 are similar and serve to implement a phase shift to a given RF signal within a given amplifier path 52-55 to account for a discrete phase change of RF signal reflected from the output of amplifier assemblies 67-70 located downstream in a combining path of the power combiner 58.

The phase change occurs when these downstream amplifier assemblies 67-70 change status from mute to active and back to mute. Each downstream amplifier assembly 67-70 is therefore characterized with a corresponding phase change value. Each discrete phase shifter can be programmed with a subset or all of the discrete phase shift values associated with each amplifier assembly, to implement a phase shift value $\varphi_n$ such that:

$$\varphi_n = \sum_{n+1}^{N} \Phi_i \cdot \delta_i \qquad \text{Eq. 1}$$

where N is the dimension of the binary word, n is a sequential value of a significant bit associated with a given amplifier path, $\phi_i$ is a phase change value associated with an $i^{th}$ amplifier assembly, And $\delta_i$ is the value of an $i^{th}$ bit within $(n+1) \leq i \leq N$ range.

In other words, if a given bit $\delta_i=1$, the corresponding phase shift is added to the sum. If the bit $\delta_i=0$ the phase change is omitted from the sum. Accordingly, the first phase shifter 74, associated with the first amplifier path 52, can apply a combination of (N−1) different phase shift values that belong to (N−1) amplifier assemblies that follow the first one. The phase shifter that belongs to the $(N-1)^{st}$ amplifier path 55 can have only one phase shift value $\phi_{N-1}=\Phi_N \cdot \delta_N$, where $\delta_N$ is the binary bit value of the MSB. As will be appreciated, the MSB will shift between zero and one during operation, affecting the phase shift values inside previous (N−1) amplifier paths. To facilitate this, the entire N-bit word sequence can be provided via a dedicated bus to each of the amplifier paths 52 and received by all phase shifters at the same time.

In the illustrated implementation, the power combiner 58 is formed from a plurality of hybrid combiners connected in series, with the output of each hybrid combiner coupled to an isolation port of a subsequent hybrid combiner, and the output of a final hybrid combiner in the series providing the output of the system, indicated here as point C. In this implementation, the first amplifier assembly 66 includes a power amplifier that provides its output to the isolation port of a first hybrid combiner of the series of hybrid combiners comprising the power combiner 58. The second amplifier assembly 67 includes two power amplifiers that each provide their output to one of the through and the coupled ports of the first hybrid combiner.

The power amplifier associated with the first amplifier assembly 66 is configured to provide a first output voltage, $V_1$, when operated in saturation. Each of the two power amplifiers associated with the second amplifier assembly 67 is configured to generate, when operated at saturation, an output voltage equal to $\sqrt{2}V_1$. When the second amplifier assembly 67 is active, it contributes an RF signal with amplitude $2V_1$ to the output of the first hybrid combiner. Accordingly, a first hybrid combiner within the power combiner 58 can deliver one of four voltage levels (0, $V_1$, $2V_1$, or $3V_1$), generated by the either or both of first amplifier assembly 44 and the second amplifier assembly. These voltage levels represent the two least significant bits of the digitized baseband input signal.

Every subsequent combining stage, represented by a hybrid combiner and its associated amplifier assembly, provides additional voltage levels. Specifically, an $r^{th}$ hybrid combiner in the power combiner 58, in combination with its associated $(r+1)^{th}$ amplifier assembly, provides RF signal with an additional $2^r$ equally spaced voltage levels for the system output. For example, a system with three RF amplifier paths and two combining stages provides output RF signal with eight equally spaced output voltage levels, with the first two amplifier paths providing four output levels and combination of all three amplifier paths providing additional four output levels. A system with four amplifier assemblies and three combining stages provides output RF signal with sixteen output voltage levels, with the first two amplifier paths providing four output levels, the third amplifier path in combination with first two amplifier paths providing four additional output levels, and a combination of all four amplifier paths providing eight additional output levels. All voltage levels are integer multiples of $V_1$. Thus, every new amplifier assembly represents an additional binary bit.

To be able to follow the binary sequence and deliver twice the voltage level of the previous stage, every additional amplifier assembly should either contain four times the number of RF power devices operating in parallel employed at the previous path amplifier or have a smaller number of correspondingly more powerful devices operating in parallel. For example, if the power amplifier in the first amplifier assembly contains one transistor in the output stage, then each output power amplifier in the second amplifier assembly should contain two transistors operating in parallel, each output power amplifier in the third amplifier assembly should contain eight transistors operating in parallel, and each output power amplifier in the fourth amplifier assembly should contain thirty-two transistors operating in parallel. The transistors can be connected in parallel using either an in-phase or an out-of-phase combiner.

As discussed previously, each discrete phase shifter 74-77 is programmed to remember individual phase shift values associated with each amplifier path $\Phi_s$. These individual phase values are measured during each amplifier path characterization process when the phase of RF signal generated by the previous amplifier path propagating down the combining path is reflected from next amplifier assemblies output. The phase of the reflected RF signal changes depending on operational status of encountered amplifier assembly. The reflected signal phase shift (ideally 180°) that happens when amplifier is switching from mute mode to voltage saturation mode is measured across operational frequency range and stored in each discrete phase shifter. To reflect this, the phase values are associated with particular significant bits received by the phase shifters through the dedicated data bus from the signal digitizer 40 of FIG. 2, as shown in Eq. 1, above. The total phase shift is determined as a function of modulation envelope amplitude and implemented for each envelope value following the sampling sequence.

The discrete RF phase shifters 74-77 are operated such that its corresponding output signal is amplified and, after propagating through the plurality of output combiners arrives to the system output in-phase with the RF signals from the other amplifier paths. The propagation path of the RF signal generated by each amplifier assembly includes reflecting of the RF signal from the output of the encountered amplifier assemblies, and thus an active amplifier assembly representing a most significant bit of the system output will have no phase shift applied. The reflection phase depends on the operational status of the encountered amplifier. Ideally the signal reflected from the inactive or mute amplifier output is out-of-phase with the signal reflected from the saturated amplifier output. To account for this phase change the signal generated by the previous significant bit amplifier should be correspondingly pre-shifted 180° out-of-phase every time when the next higher significant bit amplifier is operational. This would provide a necessary condition for the signals generated by both lower bit and higher bit amplifiers to propagate in-phase to the system output. The real value of the phase shift due to the difference in reflection angle between mute and operational saturated amplifier output is generally less than 180°. It is specific to the parasitic parameters of RF power generating device, output matching circuit and frequency of operation. Correspondingly, the phase shift correction is less than 180°.

To better understand the use of the discrete phase shifters 74-77 in providing efficient combination of the amplifier assembly outputs, it is instructive to examine the interaction of RF signal generated by the first amplifier assembly 66 with the RF signal generated at the output of the second amplifier assembly 67. If the first amplifier assembly 66 is mute, the impedance $Z_{2\_0}$ is a nominal load impedance at the outputs of the power amplifiers in second amplifier assembly 67.

When driven with a sufficiently high input RF signal, the active devices in the second amplifier assembly 67 enter voltage saturation mode. The amplitude of the output RF signal grows to a maximum value and becomes limited by the power supply voltage. At that moment, the amplitude of the output signal is no longer increasing and the efficiency of the amplifiers approaches its highest point. It will be appreciated that device operation in or close to the voltage saturation mode is most efficient.

An RF power device in voltage saturation mode is approaching a voltage source and as such exhibits low output impedance. Therefore, each amplifier in the second amplifier assembly can be considered as RF voltage source when the amplitude of the output signal of the RF power amplifying devices situated inside of the power amplifiers reaches the voltage limit determined by power supply voltage.

A typical value of power MOSFET output impedance in voltage saturated mode can be much lower than a typical value of the load impedance presented at the output of this device. Hence, devices operating in saturation mode can be qualified as a fairly good voltage source. As such, the device presents two important characteristics. First, when the device is in voltage saturation mode, the amplitude of the RF voltage at the output port of the device is not particularly sensitive to the input RF drive and is effectively determined by the power supply voltage. Therefore, an amplitude of RF signal at the output of each amplifier assembly can be tuned for a specific value by setting up a corresponding DC power supply voltage. These DC power supply voltages can be continuously refined by the linearity corrector 46 of FIG. 2 to maintain a linear operation of the system. Further, an RF signal applied from an external power source to the output port of the device will bounce back due to the high reflection coefficient of the active device output. The phase of the reflected signal depends on whether the amplifier is mute or driven into saturation.

The latter characteristic provides an opportunity for the RF signal generated by first amplifier assembly 66 to combine in-phase with the signal generated by the second amplifier assembly 67 at the output port of the first hybrid combiner and, simultaneously, to reduce load impedance at the active device output of the second amplifier assembly when both amplifiers are operational. For this, the phase of the signal supplied by the first amplifier assembly 66 should be shifted so that the first signal would arrive at the outputs of the active devices included in the output stage of the second amplifier assembly 67 out-of-phase with the signal generated by the second amplifier.

Ideally the phase step applied to the first RF signal, when both first and second paths 52 and 53 are operational, would be 180°. This phase step corresponds to the difference incurred when the same RF signal generated by a finite impedance source is being reflected from a current source (mute mode) as opposed to a voltage source (saturation mode). The corresponding phase difference between two reflected RF signals would be 180°. Therefore, if we want the reflected signals in both cases have the same phase we need to change phase of one of the incident signals 180°. In reality, the output of the active device in cut-off mode is far from being a current source. It has a strong reactive component due to inherent parasitic capacitance. As result, the phase of the RF signal reflected from the muted active device in cut-off mode can be significantly different from 0°. This makes the difference between phases of the RF signal reflected from the second amplifier output when it is in mute mode as opposed to saturated mode less than 180°. We introduced an arbitrary phase step $\phi°$ ($0° \leq \phi° \leq 180°$) that is device specific. The phase step is applied to the first RF signal when both first and second amplifiers are operational. This creates conditions for both RF signals to combine in phase at the system output.

As a result of applying the phase shift, the load impedance presented at the output port of the active devices of the second amplifier assembly 67 is reduced, which allows the power of the RF signal generated by the second amplifier output stage to grow higher while the output stage remains in voltage saturation mode. This is accomplished by constructing each amplifier path with amplifier driver stages having some extra gain and extra power level capability. This way the RF signal level generated by the driver stage is high enough for the output amplifier stage to remain in voltage saturation mode when the load impedance drops. The level of RF voltage at the output port of each active device inside the output stage of second amplifier assembly 67 is not changing during this exercise. As a result, the output power level generated by this amplifier path 53 grows inversely proportional to the load impedance change. To achieve this load pulling effect, the RF signal from the output of first amplifier assembly 66 is applied to the isolation port of the first hybrid combiner of the power combiner 58.

Following the properties of a two-way 3 dB ninety-degree hybrid splitter, the signal propagates to the outputs of amplifiers of the second amplifier assembly 43, splitting equally between them. Each signal travels further to the output port of active devices, and, in the illustrated implementation, the devices are biased in Class C and, therefore, have a high output reflection coefficient. Both amplifiers are identical and therefore have identical reflection coefficients. Both RF signals reflect back and arrive at the corresponding input ports of the output hybrid combiner with their phases shifted ninety degrees relative to each other. Given the properties of a three decibel, ninety-degree hybrid combiner, both signals will travel to the output port of the hybrid combiner and recombine there. Given a high directivity of the hybrid combiner, negligibly low level reflection signal is delivered back to the output of the first amplifier assembly 66. By propagating to the output ports of the active devices within each power amplifier the load impedance presented at the ports is changed. The direction of the change is determined by the phase relationship between two interacting RF signals at the AD output port. If the signals are out-of-phase, and the discrete phase shifter 74 associated with the first amplifier path 54 can be controlled to ensure that they are, the impedance drops. Accordingly, the output power delivered by the second amplifier assembly 67 grows inversely proportional to the impedance drop.

Figure 4:
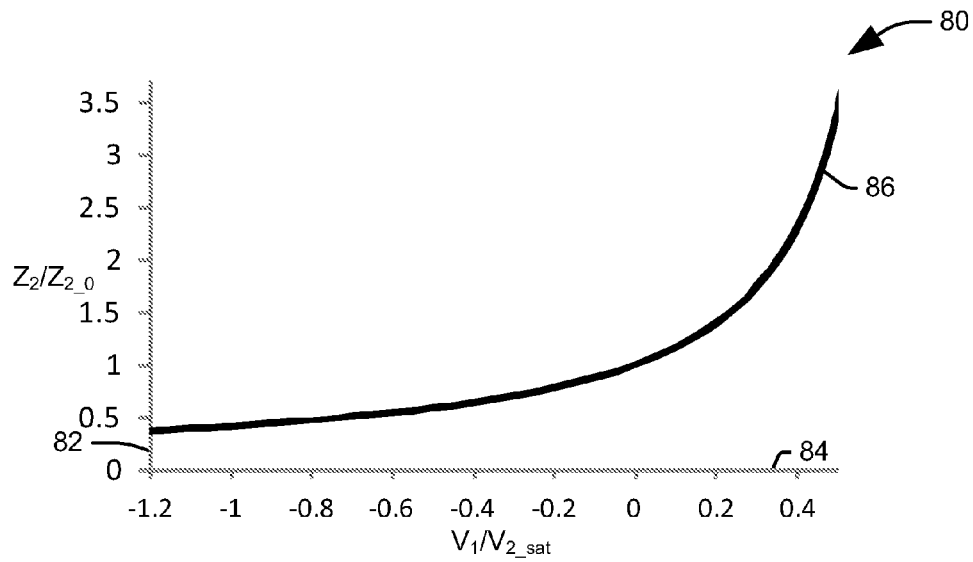
FIG. 4 is a chart illustrating the technical characteristics of one implementation of the system of FIGS. 2 and 3.
Figure 7:
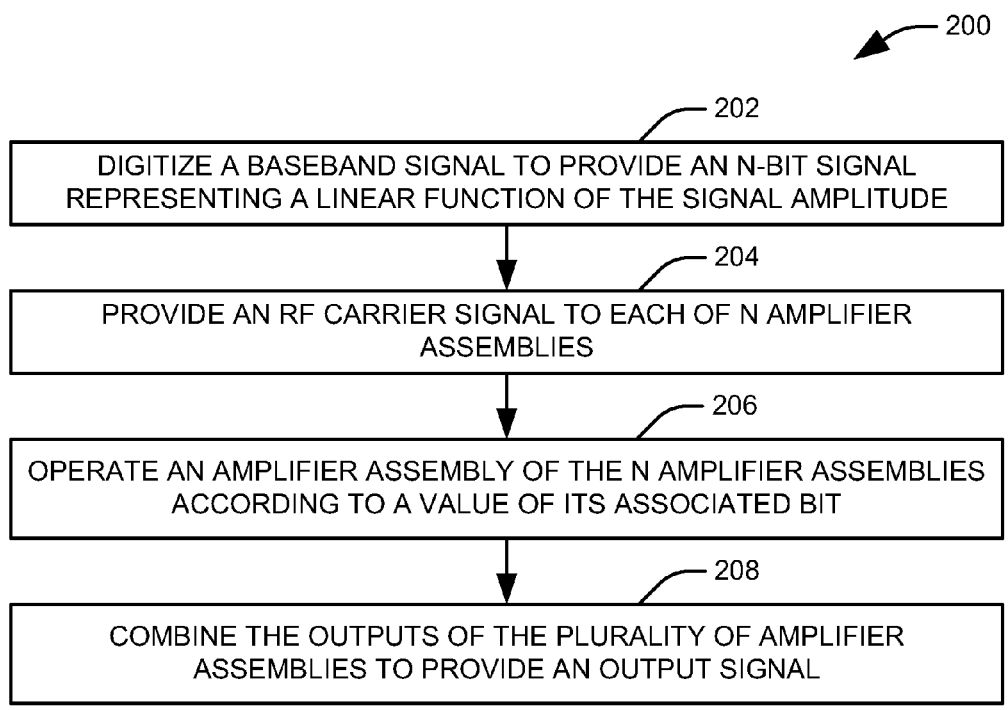
FIG. 7 illustrates one example of a method for providing an amplified radio frequency (RF) signal from a baseband input signal.

FIG. 4 is a chart 80 illustrating the effects of the first amplifier RF output voltage, $V_1$, on the load impedance, $Z_2$, presented at the output port of the active devices of the second amplifier assembly 67. A vertical axis 72 represents the ratio of $Z_2$ to the nominal load impedance, $Z_{2\_0}$. A horizontal axis 74 represents the ratio of the output voltage, $V_1$, of the first amplifier assembly 66 to a saturation voltage, $V_{2\_sat}$, of the power amplifiers of the second amplifier assembly 67. Positive values on the horizontal axis indicate that the output signal of the first amplifier assembly 66 is delivered in phase with the output signal of the second amplifier assembly 67 at the output ports of the active devices in the second amplifier assembly, while negative values indicate that the two signals are out-of-phase. The relationship between the two for the system of FIG. 2 is plotted as a solid line 76.

In general, the load impedance, $Z_{2\_sat}$, presented at the active device output port when operating at saturation can be expressed as a function of an RF signal voltage generated by the first amplifier assembly, $V_1$, and a saturation voltage, $V_{2\_sat}$, of the second amplifier assembly as:

$$Z_{2\_sat} = \frac{Z_{2\_0}}{1 - \sqrt{2}\frac{V_1}{V_{2\_sat}}} \qquad \text{Eq. 2}$$

As can be seen from the chart, the load impedance at the output of the active devices can be reduced to approximately half the nominal value when $V_1$ is equal to $(-V_{2\_sat}/\sqrt{2})$.

It will be appreciated that the phase shift applied to the carrier signal provided to the first amplifier assembly 66 and the second amplifier assembly 67 can be selected such that the signals generated by the two amplifier assemblies arrive out-of-phase with the signal generated by third amplifier assembly 44 at the output ports of the active devices within the third amplifier assembly. This can be continued for each of the N amplifier assemblies 66-70, such that an output RF signal having envelope representing the transformed amplitude of baseband input signal can be achieved.

Figure 5:
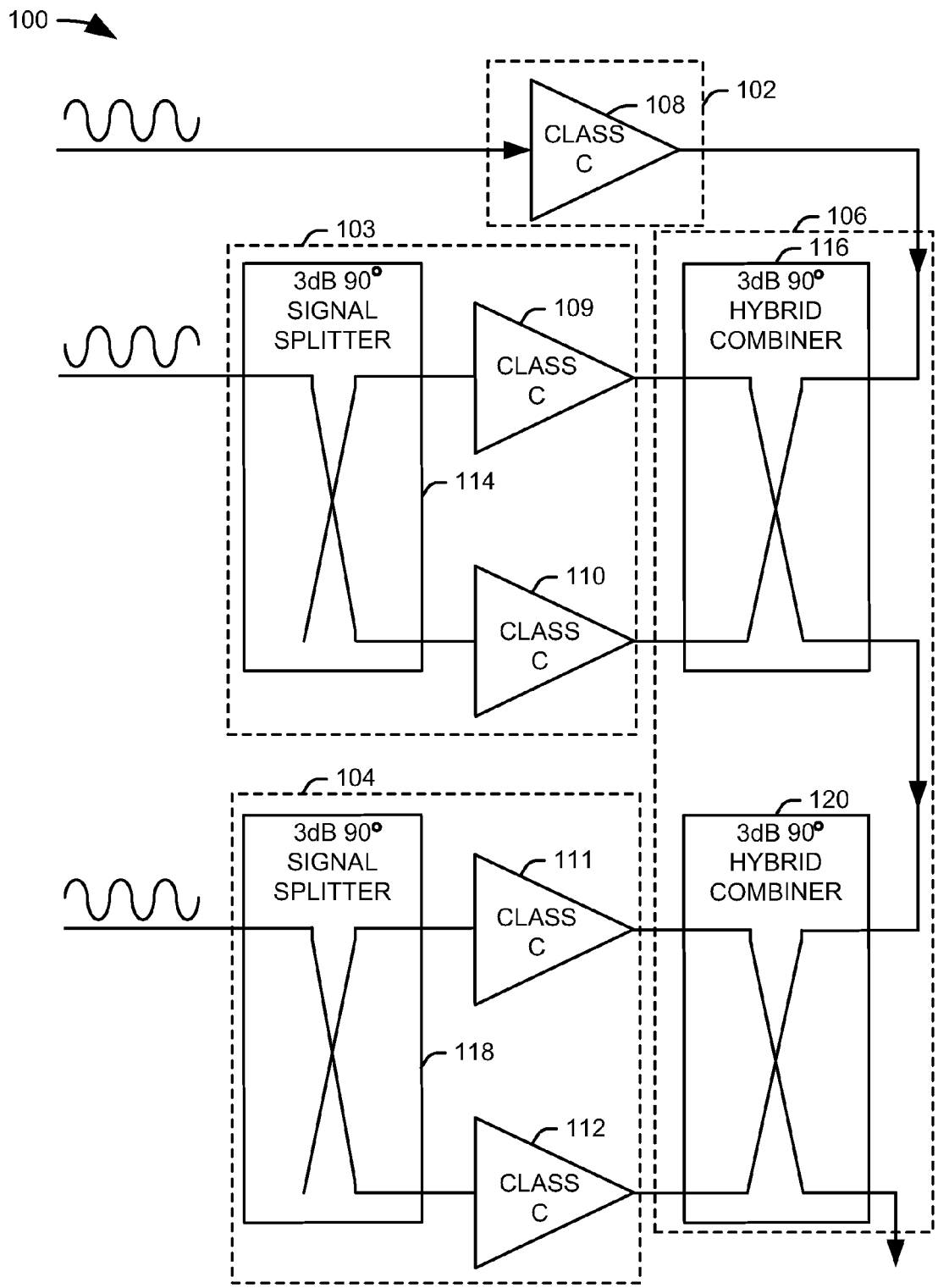
FIG. 5 illustrates a back-end, including the amplifier stages and signal combiner, of an example implementation of a system in accordance with an aspect of the present invention.

FIG. 5 illustrates a detailed view 100 of the amplifier assemblies 102-104 and a signal combiner 106, of an example implementation of a system in accordance with an aspect of the present invention. In the illustrated implementation, three amplifier assemblies 102-104 are used to provide a simplified example, although it will be appreciated that systems and methods in accordance with an aspect of the present invention can be expanded to more than three amplifier assemblies.

In the illustrated implementation, five power amplifiers 108-112 are employed to provide three amplifier assemblies, including an amplifier 108 associated with a first amplifier assembly 102, two amplifiers 109 and 110 associated with a second amplifier assembly 103, and two amplifiers 111 and 112 associated with a third amplifier assembly 104. It will be appreciated that the amplifiers 108-112 can include any appropriate assemblies for high power amplification of RF signals. For example, each amplifier 108-112 can contain one or more active devices operating in parallel, a direct current (DC) power supply for the active devices, and appropriate impedance matching circuitry at the input and output of the device. The active devices can be implemented to include, for example, metal-oxide semiconductor field effect transistors (MOSFETs), bipolar junction transistors (BJTs), junction gate field effect transistors (JFETs), or vacuum tubes. In the illustrated implementation, each of the amplifiers 85-89 is biased in class C.

Figure 6:
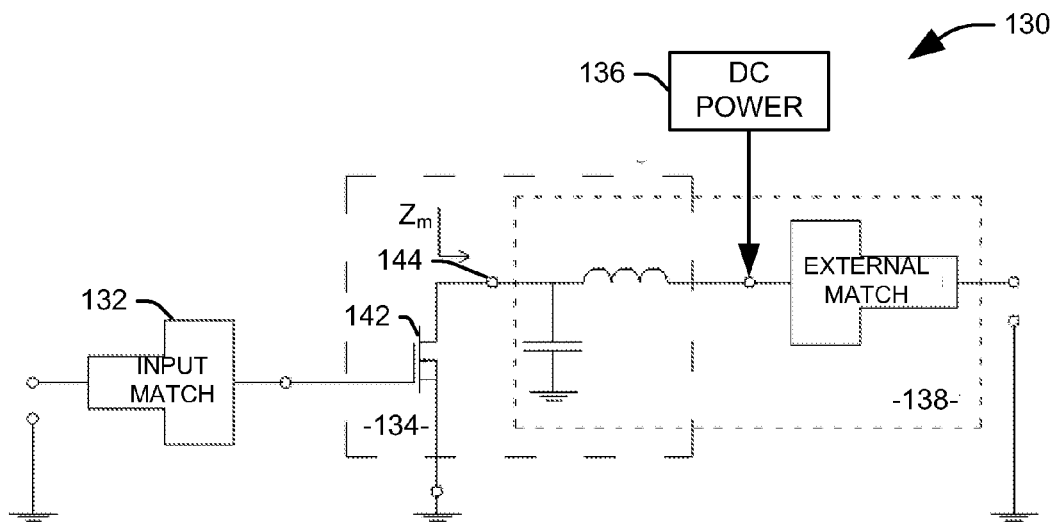
FIG. 6 illustrates one example of an amplifier that can be used in a system in accordance with an aspect of the present invention.

FIG. 6 illustrates one example of an amplifier 130 that can be used in a system in accordance with an aspect of the present invention. The amplifier 130 includes an input impedance matching component network 132, an active device 134, a direct current (DC) power supply and bias circuit 136, and an output impedance matching network 138. While the amplifier 130 is shown with one active device 134, it will be appreciated that an amplifier in accordance with an aspect of the present invention can include multiple active devices operating in parallel. For example, the amplifier could include two devices in push-pull configuration or a number of devices connected in parallel with an in-phase combining network. In the illustrated implementation, the active device 134 is implemented with a MOSFET 142. It will be appreciated, however, that the active device 134 could include one or more of a bipolar junction transistor (BJT), junction gate field-effect transistor (JFET), a vacuum tube, or a similar device. Depending on a particular kind of active device employed, a corresponding quiescent bias feed can be provided.

It will be appreciated that, throughout this document, any discussion of the impedance within an amplifier assembly refers to the impedance at the output of the active device of a given amplifier of the amplifier assembly. So, this is intended to refer to a point 144.

Returning to FIG. 5, each amplifier assembly 102-104 is provided with an RF carrier signal for amplification. The RF carrier signal is amplified at the first amplifier 108 to provide a first amplified signal, representing the first amplifier assembly 102. The second amplifier assembly 103 includes a first three-decibel, ninety-degree signal splitter 114 that distributes the RF carrier signal equally between the two identical output stage amplifiers 109 and 110 associated with the second amplifier assembly 103. Each of the output stage amplifiers 109 and 110 provide a second amplified signal to one of the through and coupled ports of a first three-decibel, ninety-degree hybrid combiner 116. The first amplified signal, from the first amplifier assembly 108, is delivered to an isolation port of the first hybrid combiner 116.

The third amplifier assembly 104 includes a second three-decibel, ninety-degree signal splitter 118 that distributes the RF carrier signal equally between the two identical output stage amplifiers 111 and 112 associated with the third amplifier assembly 104. Each of the two amplifiers 111 and 112 comprising the third amplifier assembly 104 delivers a third amplified signal to a second three-decibel, ninety-degree hybrid combiner 120. The output of the first hybrid combiner 116 is connected to an isolation port of the second hybrid combiner 120. The resulting output of the second hybrid combiner 120 represents the output of the amplifier system.

FIG. 6 illustrates a method 200 for generating a modulated radio frequency (RF) output signal representing a baseband input signal. At 202, a sample of the baseband input signal is digitized to provide an N-bit digital signal representing the input signal, where N is an integer greater than one. At 204, the input signal is transformed according to a predetermined linear function. It will be appreciated that the linear transform can be represented as a positive or negative scaling multiplier and a positive or negative offset value. In one implementation, the multiplier is one and the offset is zero, such that the resulting digital signal forms a direct proportion between the input baseband signal amplitude and output RF signal envelope.

At 206, an RF carrier signal is formed by up-converting the input baseband signal and eliminating the amplitude modulation by using amplitude hard limiter. At 208, the RF carrier signal is provided to each of N amplifier assemblies. In one implementation, (N−1) summary status values $\phi_n$ are also derived from the baseband input signal, representing phase shifts to be applied to the inputs of at least some of the N amplifier assemblies. Accordingly, a phase shift can be selectively applied to the RF carrier signal supplied to at least a subset of the N amplifier assemblies according to the value of $\phi_n$, such that a given amplifier assembly in the subset receives the RF carrier signal with a predetermined phase shift when its associated bit assumes a first value and without the predetermined phase shift when its associated bit assumes a second value.

At 210, each of the N amplifier assemblies are operated according to the value of an associated significant bit within the N-bit word, such that a given amplifier assembly is active when its associated bit assumes a first value and mute when its associated bit assumes a second value. Amplitudes of RF signals generated by different amplifier paths can differ from each other, such that the combined output of the N amplifier assemblies has an applied amplitude modulation representing the transformed digitized baseband input signal. For example, each assembly can have a operating output voltage of generated RF signal twice that of a preceding amplifier assembly. At 212, the output signals of the N amplifier assemblies are combined to provide the output RF output signal. For example, the output signals of the N amplifier assemblies can be delivered to a series of hybrid combiners in which an output port of each hybrid combiner in the series, other than a final hybrid combiner in the series, is connected to an isolation port of a subsequent hybrid combiner in the series. The output of the final hybrid combiner in the series provides the system output.

The systems and methods described in FIGS. 1-6 provide a number of advantages. RF communication signals created with digital modulation techniques can be characterized by a Peak-to-Average Power Ratio (PAPR). The high definition television broadcast industry employs such modulation standards, for example, in the Very High Frequency (VHF) and Ultra High Frequency (UHF) bands. One example would be the Digital Video Broadcasting-Terrestrial (DVB-T) modulation used in many countries around the world. A single TV channel can include many spectral carriers (e.g., thousands) tightly spaced over an 8 MHz frequency range. This creates a signal with amplitude modulated envelope varying between zero amplitude and amplitude of 6 db to 12 dB above average signal level depending on the modulation standard used.

Currently used Class AB RF amplifiers operate at average power levels backed off from their peak power capability by the factor of PAPR. This leads to a relatively low DC-RF efficiency. A system in accordance with the present invention allows for the use of power amplifiers biased in class C and operating at or near saturation much of the time, greatly increasing the efficiency of the system.

In addition, the systems and methods described herein are not frequency sensitive. Most countries have their frequency range allocated for television (TV) channels that spans from 470 MHz to 862 MHz at UHF and from 175 MHz to 252 MHz at VHF. The TV allocated frequency span at UHF is 59% wide and at VHF is 36% wide. Many broadcasting networks prefer to have transmitters that can operate at any channel within UHF or VHF frequency range without physical adjustments.

A system in accordance with the present invention provides such possibility by incorporating a lossless load pulling at the active device output to the frequency range boundaries of a three-decibel hybrid combiner. This is done by introducing a novel output power combining technique. As a result, a high efficiency, high power amplitude modulator can operate across a frequency range as wide as the bandwidth of 3 dB hybrid combiner. The operating bandwidth of three decibel hybrid combiners can be extended by adding quarter wavelength sections to the construction of the combiner and properly organizing the corresponding coupling levels between transmission lines.

From the above description of the invention, those skilled in the art will perceive improvements, changes, and modifications. Such improvements, changes, and modifications within the skill of the art are intended to be covered by the appended claims.

Having described the invention we claim:

1. A system for generating a modulated radio frequency (RF) output signal representing an analog baseband input signal, the system comprising:
    a digitizer configured to sample the analog baseband input signal and produce an N-bit digital signal representing a scaled linear function of the signal amplitude, where N is an integer greater than one, the digitizer utilizing an analog-to-digital amplitude converter with equal input voltage steps to provide the N-bit digital signal as a series of multi-bit binary word values, with each multi-bit binary word value varying in proportion to the instantaneous amplitude of the input signal at respective sampling times;
    an RF signal source configured to produce an RF carrier signal;
    N amplifier paths, each comprising at least one amplifier configured to receive the RF carrier signal as an input and provide a corresponding output RF signal, the amplifiers associated with each of the N amplifier paths being active only when a corresponding bit of the digital signal assumes a first value and each of the N amplifier paths providing a maximum voltage out that is different from each other of the N amplifier paths; and
    a power combiner assembly configured to combine the outputs of the plurality of amplifier paths to deliver the modulated RF output signal.

2. The system of claim 1, wherein each of the at least one amplifier has an associated power supply and an output DC voltage provided by each power supply is tuned to adjust the amplitude of the RF signal generated by each amplifier path to a precisely scaled value, such that each amplifier path, when its associated at least one amplifier is active, provides an output having a constant amplitude equal to the precisely scaled value.

3. The system of claim 2, further comprising a linearity corrector configured to receive a digital signal representing the modulated RF output signal and compare it to the N-bit digital signal and tune the output DC voltage associated with each amplifier path to maintain a linear response of the system.

4. The system of claim 1, wherein each amplifier path comprises an RF switch responsive to its associated digital bit such that the RF carrier signal is provided when the bit assumes a first value and the RF carrier signal is not provided when the bit assumes a second value.

5. The system of claim 4, further comprising a common RF carrier source derived from input baseband signal that supplies an RF carrier signal to the input of each RF switch associated with each amplifier path, the RF carrier source comprising:
- an upconverter configured to produce a signal at a desired RF frequency;
- a bandpass filter operatively connected to the upconverter and centered around the desired RF frequency configured to produce a filtered RF signal; and
- an amplitude limiter configured to remove any amplitude modulation from the filtered RF signal.

6. The system of claim 1, further comprising a plurality of discrete phase shift components, each associated with one of a subset of the amplifier paths, the RF carrier signal being provided to the at least one amplifier associated with each amplifier path in the subset through its associated discrete phase shift component such that a phase of the RF carrier signal provided to each amplifier associated with the subset of amplifier paths is selectable.

7. The system of claim 6, further comprising a dedicated data bus that broadcasts the content of all significant bits within the digital signal to each of the plurality of phase shift components and a plurality of RF switches associated with the N amplifier paths, each discrete phase shift component being configured to select among a plurality of discrete phase values to provide for the RF carrier signal according to an associated set of at least one bit in the N-bit digital signal to dynamically control a phase of the RF carrier signal provided to its associated at least one amplifier by applying a phase shift directly proportional to the supplied integer value.

8. The system of claim 1, the power combiner assembly comprising a plurality of hybrid combiners, an output port of a first hybrid combiner being connected to an isolation port of a second hybrid combiner.

9. The system of claim 8, each of the first hybrid combiner and the second hybrid combiner comprising three-decibel ninety-degree directional couplers.

10. The system of claim 1, each of the amplifiers associated with the plurality of amplifier assemblies being biased in class C.

11. The system of claim 1, further comprising a plurality of continuous phase shifters configured to delay the RF carrier signal to account for differences in path length between a common RF carrier source providing the RF carrier signal and each of the plurality of amplifier paths.

12. The system of claim 1, wherein each of the N amplifier paths comprises an amplifier driver stage configured to have a power level capability sufficient to drive an associated output amplifier stage to voltage saturation mode for a load impedance less than the nominal load impedance associated with the system.

13. A method for generating a modulated radio frequency (RF) output signal representing a baseband input signal comprising:
- digitizing a sample of the baseband input signal to provide an N-bit digital signal representing an amplitude of the baseband input signal, where N is an integer greater than one;
- providing an RF carrier signal to each of N amplifier assemblies;
- operating each of the N amplifier assemblies according to the value of a corresponding bit within the N-bit word, such that a given amplifier assembly is active when its associated bit assumes a first value and mute when its associated bit assumes a second value;
- selectively applying a phase shift to the RF carrier signal provided to each of a first N−1 of the N amplifier assemblies, the applied phase shift associated with a given amplifier assembly being determined as a function of the values of all bits within the N-bit digital signal that are more significant than the bit associated with the given amplifier assembly; and
- combining the outputs of the N amplifier assemblies to construct the modulated RF output signal.

14. The method of claim 13, wherein combining the outputs of the N amplifier assemblies comprises providing the outputs of the N amplifier assemblies to a series of hybrid combiners in which an output port of each hybrid combiner in the series, other than a final hybrid combiner in the series, is connected to an isolation port of a subsequent hybrid combiner in the series.

15. The method of claim 14, each of hybrid combiners comprising a three-decibel ninety-degree hybrid combiner.

16. A system for generating a modulated radio frequency (RF) output signal representing a baseband input signal, the system comprising:
- a digitizer configured to sample the baseband input signal and produce a digital signal representing a linear function of the signal amplitude;
- an RF signal source configured to produce an RF carrier signal;
- a plurality of amplifier assemblies, each comprising at least one amplifier configured to receive the RF carrier signal as an input and amplify the RF carrier signal only when a corresponding bit of digital signal assumes a first value
- a plurality of continuous phase shifters configured to delay the RF carrier signal to account for differences in path length between the RF signal source and each of the plurality of amplifier paths; and
- a power combiner assembly configured to combine the output signals of the plurality of amplifier assemblies to provide the modulated RF output signal, the power combiner assembly comprising a series of hybrid combiners, an output port of each hybrid combiner in the series, other than a final hybrid combiner in the series, being connected to an isolation port of a subsequent hybrid combiner in the series.

17. The system of claim 16, wherein the plurality of amplifier assemblies comprises:
- a first amplifier assembly comprising a first amplifier connected to an isolation port of the first hybrid combiner; and
- a series of amplifier assemblies, each comprising at least a first amplifier connected to a coupled port of an associated one of the series of hybrid combiners and a second amplifier connected to a through port of the associated one of the series of hybrid combiners.

18. The system of claim 16, further comprising a plurality of phase shift components, each associated with one of the plurality of amplifier assemblies and configured to apply a discrete value of a phase delay to the RF carrier signal being provided to its associated amplifier assembly such that the outputs of the plurality of amplifier assemblies combine constructively at the output of the power combiner assembly, the discrete value of phase delay provided by each phase shift component being responsive to at least one bit of the digital signal.

19. The system of claim 16, further comprising:
an RF demodulator configured to downconvert a sampled signal representing the modulated RF output signal to a frequency associated with the baseband input signal;
an analog to digital converter to provide a digital feedback signal representing the downconverted sampled signal; and
a linearity corrector configured to receive the digital feedback signal representing the modulated RF output signal and compare it to the N-bit digital signal and tune an output DC voltage associated with each amplifier path to maintain a linear response of the system.

20. The system of claim 16, each of hybrid combiners comprising a three-decibel ninety-degree hybrid combiner.

* * * * *